(12) United States Patent
Bonilla et al.

(10) Patent No.: US 10,103,068 B2
(45) Date of Patent: Oct. 16, 2018

(54) DETECTING A VOID BETWEEN A VIA AND A WIRING LINE

(71) Applicant: GLOBALFOUNDRIES INC., Grand Cayman (KY)

(72) Inventors: Griselda Bonilla, Hopewell Junction, NY (US); Samuel S. S. Choi, Hopewell Junction, NY (US); Ronald G. Filippi, Wappingers Falls, NY (US); Elbert E. Huang, Carmel, NY (US); Naftali E. Lustig, Croton on Hudson, NY (US); Andrew H. Simon, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 489 days.

(21) Appl. No.: 14/743,208

(22) Filed: Jun. 18, 2015

(65) Prior Publication Data

US 2016/0370421 A1 Dec. 22, 2016

(51) Int. Cl.
*H01L 21/66* (2006.01)
*G01R 31/28* (2006.01)

(52) U.S. Cl.
CPC .......... *H01L 22/12* (2013.01); *G01R 31/2853* (2013.01); *H01L 22/14* (2013.01); *H01L 22/34* (2013.01)

(58) Field of Classification Search
CPC ......... H01L 22/12; H01L 22/34; H01L 22/14; G01R 31/2853

(Continued)

(56) References Cited

U.S. PATENT DOCUMENTS 5,504,017 A 4/1996 Yue et al.
6,091,080 A * 7/2000 Usui .................. H01L 23/5223
257/48

(Continued)

OTHER PUBLICATIONS

Matsui et al., "High-energy scanning electron microscope for the observation of subsurface structures", Journal of Micro/Nanolithography, MEMS, and MOEMS, 4(4), pp. 043007.1-043007.8 (2005).

(Continued)

*Primary Examiner* — Melissa Koval
*Assistant Examiner* — Trung Nguyen
(74) *Attorney, Agent, or Firm* — Anthony Canale; Andrew M. Calderon; Roberts Mlotkowski Safran Cole & Calderon, P.C.

(57) ABSTRACT

A semiconductor device includes a first circuit structure and a second circuit structure. The first circuit structure includes a wiring line and a via upon and electrically contacting the wiring line. The via induces lateral etching voids between the via and the wiring line below the via upon the surface of the wiring line. The second circuit structure includes a similar wiring line, relative to the reference wiring line, without or fewer via thereupon. The first circuit structure is therefore relatively more prone to lateral etching void formation as compared to the second circuit structure. Resistances are measured across the first circuit structure and the second circuit structure and compared against a comparison threshold to determine whether the first circuit structure includes one or more lateral etching voids. If the first structure is deemed to not include lateral etching voids, the fabrication process of the device may be deemed reliable.

19 Claims, 8 Drawing Sheets

(58) Field of Classification Search
USPC .............. 324/500, 600, 762.01–763.02, 508,
324/523–533, 750.01–754.19, 756.01,
324/757.01, 758.01, 759.01–762.01, 555,
324/612, 639, 659, 701
See application file for complete search history.

(56) References Cited

U.S. PATENT DOCUMENTS

| | | |
|---|---|---|
| 6,544,802 B1 | 4/2003 | Jun et al. |
| 7,026,175 B2 | 4/2006 | Li et al. |
| 7,733,109 B2 | 6/2010 | Ahsan et al. |
| 8,399,266 B2 | 3/2013 | Mo et al. |
| 8,723,115 B2 | 5/2014 | Xiao et al. |

OTHER PUBLICATIONS

Matsui et al., "Detecting Defects in Cu Metallization Structures by Electron-Beam Wafer Inspection", Journal of the Electrochemical Society, vol. 151, No. 6, pp. G440-G442, 2004.
Liao et al., "Detecting buried voids in copper interconnect", Proc. IEEE Symposium on e-Manufacturing & Design Collaboration (eMDC), pp. 1-4 (2013).
Xiao et al.,"Capturing buried defects in metal interconnections with electron beam inspection system". Proc. SPIE Advanced LithographySymposium 8681,pp. 86810F-1 to 12, (2013).
Sakai et al., "Defect isolation and characterization in contact array/chain structures by using Voltage contrast effect", Proceedings of IEEE International Symposium on Semiconductor Manufacturing Conference, pp. 195-198 (1999).

\* cited by examiner

DETECTING A VOID BETWEEN A VIA AND A WIRING LINE

FIELD

Embodiments of invention generally relate to semiconductor devices, design structures for designing a semiconductor device, and semiconductor device fabrication methods. More particularly, embodiments relate to semiconductor structures including comparable circuit structures utilized to determine the existence of a void between a circuit wiring line and a via.

RELATED ART

Semiconductor devices such as a wafer, chip, etc. may include via contacts and wiring lines that are formed by patterning a dielectric layer, such as silicon oxide insulating layer, with open trenches where the contact and lines should be. The patterning process typically utilizes a mask, such as a hard mask, to transfer a pattern to the underlying dielectric layer. Typically, the contact via and wiring lines may be further formed from a thick coating of copper that significantly overfills the trenches is deposited on the dielectric layer and within the trenches, and chemical-mechanical planarization (CMP) is used to remove overburden copper that extends above the top of the insulating layer. Copper sunken within the trenches of the dielectric layer is not removed and becomes the patterned conductor. Damascene processes generally form and fill a single feature (i.e., either the contact via or wiring line) with copper per Damascene stage. Dual-Damascene processes generally form and fill two features (i.e., both the contact via and wiring line) with copper at once.

During mask removal, voids may form due to copper surfaces being etched laterally. These voids may be located between the wiring line and the contact via at the surface of the wiring line and below and/or lateral to the contact via. Such voids may enlarge over time and/or reduce yield.

Detecting voids is important to ensure that reliability failures related to the voids do not occur. Methods for detecting voids, such as obtaining cross sections of the semiconductor device and inspecting the cross section for voids results in the description of the semiconductor device.

SUMMARY

In a first embodiment of the present invention, a method to detect the existence of voids created by lateral etching between a wiring line and a contact via at the surface of the wiring line and below the contact via within a semiconductor structure includes measuring resistance across a first circuit structure prone to lateral etching voids, measuring resistance across a second circuit structure not prone to lateral etching voids, comparing the measured resistance across the first circuit structure with the measured resistance across the second circuit structure against a threshold, and determining the first circuit structure includes one or more lateral etching voids if the compared measured resistance across the first circuit structure and the measured resistance across the second circuit structure does not equal the threshold.

In another embodiment of the present invention, a semiconductor structure includes a first circuit structure and a second circuit structure. The first circuit structure is prone to lateral etching voids between a reference wiring line and one or more void-inducing contact vias at the surface of the wiring line and below the respective void-inducing contact vias. The second circuit structure is not prone to lateral etching voids and includes a wiring line dimensionally similar to the reference wiring line and fewer void-inducing contact vias relative to the first circuit structure.

In yet another embodiment of the present invention, the semiconductor structure may be located within a design structure embodied in a machine readable storage medium for designing, manufacturing, or testing an integrated circuit.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

According to embodiments of the present invention, a semiconductor device such as a wafer, integrated circuit (IC) chip, etc. includes a first circuit structure and a second circuit structure. The first circuit structure includes a wiring line and a contact via upon and electrically contacting the wiring line. The contact via within the first circuit structure induces void formation within and does not contribute to the resistance of the first circuit structure. The second circuit structure includes a similar wiring line, relative to the first circuit structure, without the contact via thereupon. The first circuit structure is generally the structure to be analyzed to determine whether the structure includes one or more voids located between the wiring line and the contact via at the surface of the wiring line and below and/or lateral to the contact via. The second circuit structure is not prone to include voids due to the absence of the contact via upon the similar wiring line. Resistances are measured of the first circuit structure and the second circuit structure and compared to determine whether the first circuit structure includes one or more voids located between the wiring line and the contact via at the surface of the wiring line and below and/or lateral to the contact via.

Figure 1A:
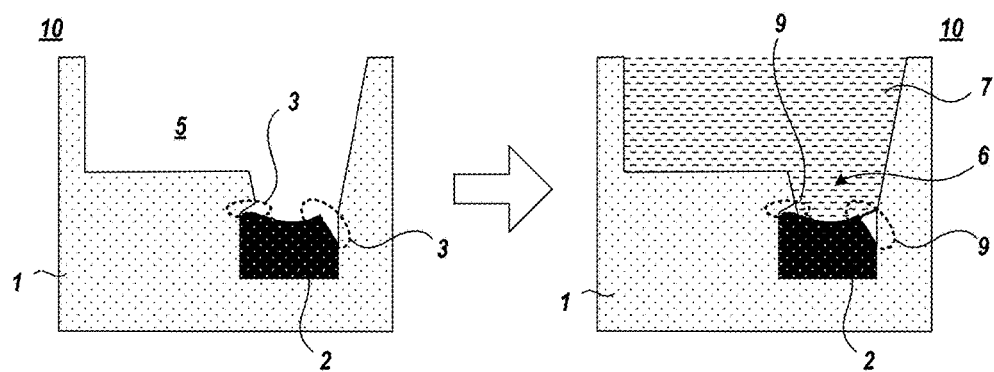
FIG. 1A and FIG. 1B depict cross section views of a semiconductor structure during semiconductor device fabrication stages, in accordance with various embodiments of the present invention.
Figure 1B:
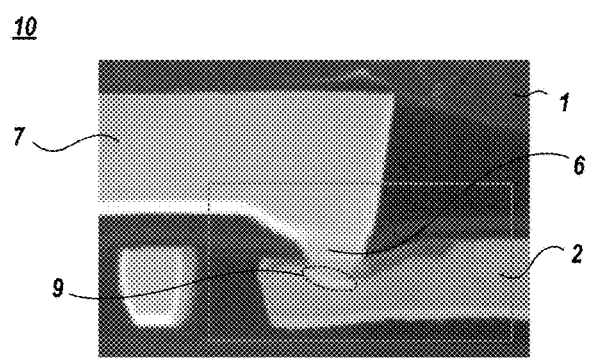

FIG. 1A and FIG. 1B depict cross section views of a semiconductor structure during semiconductor device fabrication stages, in accordance with various embodiments of the present invention. The depicted semiconductor structure may be a wafer, IC chip, etc. and includes a semiconductor material 1 and a wiring line 2. The semiconductor material 1 may be a single material layer or a multi-layer material layer. The wiring line 2 is a conductive layer such as a metal.

A trench 5 may be formed by patterning the semiconductor material 1 located where a contact via 6 and wiring line 7 should be. The patterning process typically utilizes a mask (not shown) deposited upon the semiconductor material 1 to transfer the pattern to the underlying the semiconductor material 1. During mask removal defects 3 may be introduced by the removal of portions of the wiring line 2. Such defects 3 may also be known as lateral etch defects.

Contact via 6 and wiring line 7 may be further formed by depositing a conductive material, such as a metal, within trench 5. A CMP process may subsequently remove overburden conductive material that extends above the top of the semiconductor material 1. The conductive material sunken within trench 5 is not removed and becomes contact via 6 and wiring line 7. The contact via 6 may be formed in a single formation stage (i.e. a damascene process) or the contact via 6 and wiring line may be simultaneously formed in a single formation stage (i.e., a dual-damascene processes). The wiring line 2, the contact via 6, and the wiring line 7 may be a similar conductive material, such as copper.

Voids 9 may be formed by the conductive material generally not filling defects 3. Void 9 are located between the wiring line 2 and the contact via 6 at the surface of the wiring line 2 and below and/or lateral to the contact via 6. Voids 9 may enlarge over time and or reduce yield of the semiconductor structure. Detecting voids 9 is important to ensure that reliability failures do not occur.

Figure 2:
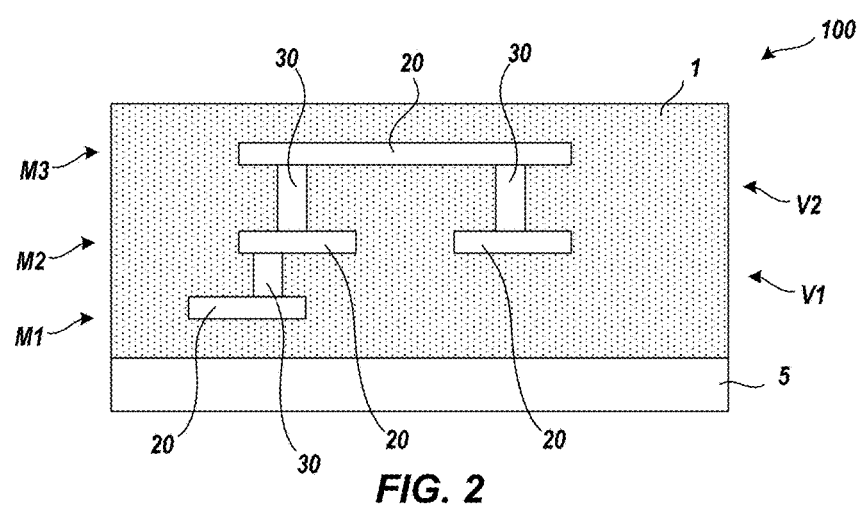
FIG. 2 depicts a cross section view of a semiconductor structure including multiple wiring layers and multiple contact via layers, in accordance with various embodiments of the present invention.

FIG. 2 depicts a cross section view of a semiconductor structure including multiple wiring layers M1, M2, and M3 and multiple contact via layers V1 and V2 organized in a circuit structure 100, in accordance with various embodiments of the present invention. The semiconductor structure may include a substrate 5 upon which the semiconductor material 1 is formed. The substrate 5 may be a layered substrate, a bulk substrate, etc. Micro semiconductor devices (not shown) such as transistors, etc. may be formed upon or within substrate 5 and is generally in electrical contact with a wiring line 20 as is known in the art.

Circuit structure 100 includes a wiring line 20 within a first wiring layer M1, multiple wiring lines 20 within a second wiring layer M2, and a wiring line 20 within a third wiring layer M3. Wiring arrangement 100 includes a contact via 30 in a first via layer V1 that electrically connects the M1 wiring line 20 and the M2 wiring line 20 and contact vias 30 in a second via layer V2 that electrically connects the respective M2 wiring lines 20 and the M3 wiring line 20. The contact vias 30 are typically perpendicular to the wiring lines 20. In this paper, via 30 may be interchangeable with via 6, wiring line 2, 7 may be interchangeable with wiring line 20, etc.

M1 may be a first metal layer, V1 is via layer above first metal layer M1, M2 may be a second metal layer above via layer V1, V2 is a via layer above second metal layer M2, and M3 may be a third metal layer above second metal layer M2. The width of relative lines 20 within the metal layers M1, M2, M3 may or may not be similar and are not essential to embodiments of the invention—such embodiments may be utilized for minimum width lines or for wider lines, etc. It is noted that the first, second, and third denotations used in the specification may not correspond to those used in the claims, i.e., what is first and second in the claims may vary depending on the embodiment being referenced. In addition, metal layers M1, M2, M3 and via layers V1, V2 may be located anywhere within the various levels of the semiconductor structure. Hence, their denotation as first, second, etc., is not intended to denote a position within the semiconductor structure.

A conductor material of wiring line 20 and a conductor material of contact vias 30 can be, for example, Al, Cu, W, Ti, TiN, or silicides, with Cu frequently being used in the popular Cu dual damascene processes. Such processes typically include subsequent to the formation of a reference layer (i.e., the M1 layer), the surface overburden of the conductor material of the reference layer is removed using, for example, CMP, or selective reactive ion etching (BRIE). An etch stop layer (not shown) may be deposited upon an inter layer dielectric (ILD) within the semiconductor material 1. The etch stop layer can be composed of SiN, SiC, phosphosilicate glass (PSG), and the like. Another ILD layer may be formed upon the etch stop layer wherein trenches may be formed and layer filled with conductor material and overburden stripped, thereby forming e.g., V1 and M2. Such processes may be repeated to form further layers M3, V2, M4 (not shown), V3 (not shown), etc.

Figure 3:
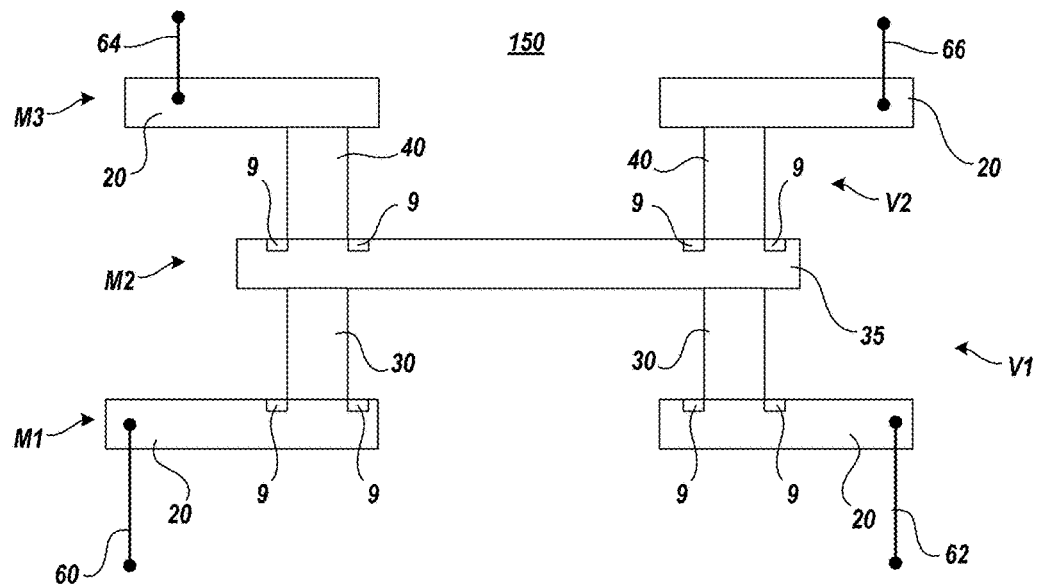
FIG. 3-FIG. 10 depicts semiconductor structure wiring line and contact via arrangements, in accordance with various embodiments of the present invention.

FIG. 3 depicts an exemplary circuit structure 150 including at least a reference wiring line 35 including one or more void-inducing-vias 40 formed upon and electrically contacting the reference wiring line 35. The void-inducing-via 40 may or may not induce a void 9 between the void-inducing-via 40 and the reference wiring line 35 at the surface of the reference wiring line 35 and below and/or lateral to the void-inducing-via 40. The actual existence of void 9 is determined by comparing resistance measurements between circuit structure 150 and a second circuit structure, later described. The void-inducing-via 40 does not, in and of itself, add resistance to the reference wiring line 35. The reference line 35 of circuit structure 150 is compared to a same or otherwise similar wiring line of the second circuit structure including fewer void-inducing vias thereupon.

The circuit structure 150 may further include wiring lines 20 within a lower metal layer or a higher metal layer, relative to the reference wiring line 35. For example, if reference wiring line 35 is located in M2, circuit structure 150 may further include one or more wiring lines 20 within M1 and/or one or more wiring lines 20 within M3. The circuit structure 150 may further include contact vias 30 within a lower via layer, relative to reference wiring line 35. For example, if reference wiring line 35 is located in M2, circuit structure 150 may further include a contact via 30 within V1 that electrically connects the wiring line 20 within M1 and the reference wiring line 35.

Depending upon the implementation, the void-inducing-via 40 may or may not electrically contact the wiring line 20 in the higher metal layer. For example, if reference wiring line 35 is located in M2, the void-inducing-via 40 within V2 electrically connects the wiring line 20 within M3 and the reference wiring line 35.

The resistance across the circuit structure 150 and across the reference wiring line 35 may be measured utilizing known resistance measurement techniques. For example, the resistance across circuit structure 150 may be measured between node 60 and node 62, between node 60 and node 66, or between node 64 and between 62.

Figure 4:
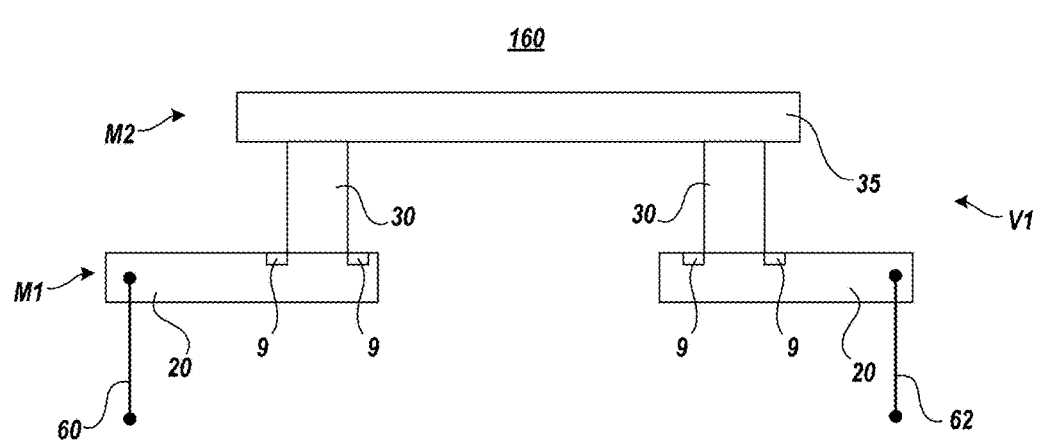

FIG. 4 depicts an exemplary circuit structure 160 including at least a reference wiring line 35 similar to the reference wiring line 35 of circuit structure 150. Unless otherwise indicated herein, reference line 35 of a first circuit structure being similar to reference line 35 of the second circuit structure shall mean the reference lines have the same dimensions. Generally, circuit structure 160 and circuit structure 150 may be compared to determine whether voids 9 exist between the void-inducing-via 40 and the reference wiring line 35 at the surface of the reference wiring line 35 and below and/or lateral to the void-inducing-via within circuit structure 150.

Circuit structure 160 includes less than or no void-inducing vias 40 formed upon and electrically contacting the reference wiring line 35 within structure 160, relative to the number of void-inducing vias 40 formed upon and electrically contacting the reference wiring line 35 within structure 150. Therefore, within circuit structure 160, the number of voids 9 are less than respective induced voids 9 within circuit structure 150. In other words, circuit structure 150 is more prone to forming voids 9 relative to circuit structure 160.

The circuit structure 160 may further include wiring lines 20 within a lower metal layer or a higher metal layer, relative to the reference wiring line 35. For example, if reference wiring line 35 is located in M2, circuit structure 160 may further include one or more wiring lines 20 within M1, as depicted, and/or one or more wiring lines 20 within M3 (not shown). The circuit structure 160 may further include contact vias 30 electrically connecting the respective wiring line 20 to reference wiring line 35. For example, if reference wiring line 35 is located in M2, circuit structure 160 may further include a contact via 30 within V1 that electrically connects the wiring line(s) 20 within M1 and the reference wiring line 35.

The resistance across the circuit structure 160 and across the reference wiring line 35 may be measured utilizing known resistance measurement techniques. For example, the resistance across circuit structure 160 may be measured between node 60 and node 62, as depicted. Because the number of induced voids 9 within circuit structure 160 associated with reference line 35 is less relative to circuit structure 150, the resistance across reference line 35 and across circuit structure 160 should be less than the resistance across reference line 35 within circuit structure 150.

For clarity, the compared resistances across circuit structure 160 and across circuit structure 150 should be measured between similar relative nodes. For example, if the resistance across circuit structure 150 is measured between nodes 60 and 62 of circuit structure 150, the comparison resistance across circuit structure 160 should also be measured between nodes 60 and 62 of circuit structure 160.

In comparing the measured resistances of the circuit structure 150 and circuit structure 160, the existence of voids 9 associated with reference line 35 within circuit structure 150 may be determined if the comparison (e.g., difference, ratio, etc.) between the resistance across reference line 35 and circuit structure 150 and the resistance across reference line 35 and circuit structure 160 exceeds a predetermined threshold. The threshold increases proportionally with the difference between the number of void-inducing vias of circuit structure 150 and the number of void-inducing vias of circuit structure 160 (if any).

Figure 5:
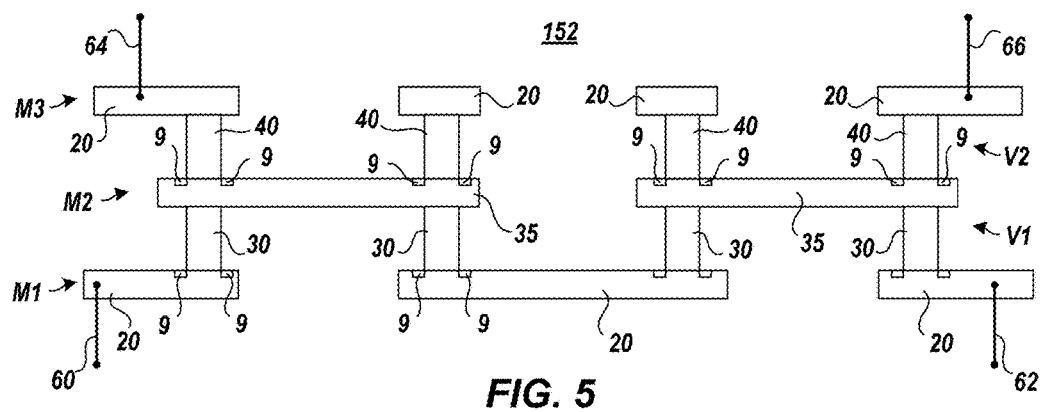

FIG. 5 depicts an exemplary circuit structure 152 including a multiple reference wiring lines 35 including one or more void-inducing-vias 40 formed upon and electrically contacting the reference wiring lines 35, respectively. The void-inducing-via 40 may or may not induce a void 9 between the void-inducing-via 40 and the reference wiring line 35 at the surface of the reference wiring line 35 and below and/or lateral to the void-inducing-via 40. The actual existence of void 9 is determined by comparing resistance measurements between circuit structure 152 and a second circuit structure, later described.

The circuit structure 152 may further include wiring lines 20 within a lower metal layer and a higher metal layer, relative to the reference wiring lines 35. For example, if the reference wiring lines 35 are located in M2, circuit structure 152 may further include one or more wiring lines 20 within M1 and one or more wiring lines 20 within M3. The circuit structure 152 may further include contact vias 30 within a lower via layer, relative to reference wiring lines 35. For example, if reference wiring lines 35 are located in M2, circuit structure 152 may further include contact vias 30 within V1 that electrically connect wiring lines 20 within M1 and the reference wiring lines 35, respectively. Depending upon the implementation, the void-inducing-via 40 may electrically contact the wiring line 20 in the higher metal layer. For example, if reference wiring lines 35 are located in M2, the void-inducing-via 40 within V2 electrically connects wiring line 20 within M3 and the reference wiring lines 35, respectively.

The resistance across the circuit structure 152 and across the reference wiring lines 35 may be measured utilizing known resistance measurement techniques. For example, the resistance across circuit structure 152 and across the reference wiring lines 35 may be measured between node 60 and node 62, between node 60 and node 66, or between node 64 and between 62.

Figure 6:
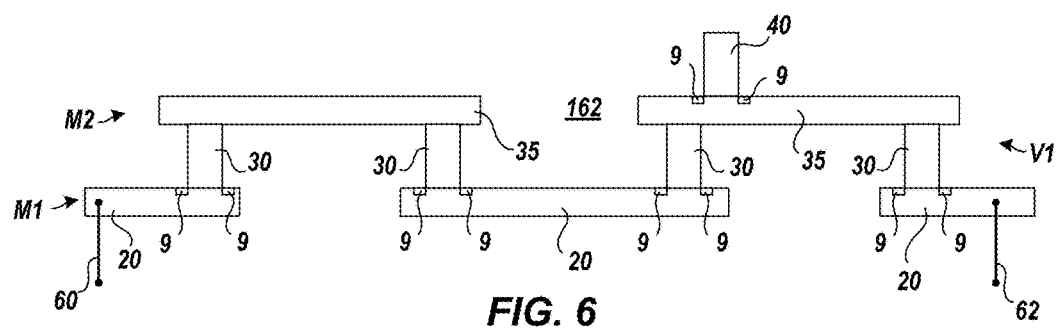

FIG. 6 depicts an exemplary circuit structure 162 including multiple reference wiring lines 35 similar to the reference wiring lines 35 of circuit structure 152. Generally, circuit structure 162 and circuit structure 152 may be compared to determine whether voids 9 exist between the void-inducing-via 40 and the reference wiring lines 35 at the surface of the reference wiring lines 35 and below and/or lateral to the void-inducing-via within circuit structure 152.

Circuit structure 162 includes less than or no void-inducing vias 40 formed upon and electrically contacting respective reference wiring lines 35 within structure 162, relative to the number of void-inducing vias 40 formed upon and electrically contacting the reference wiring lines 35 within structure 152. Therefore, within circuit structure 162, the number of voids 9 between the void-inducing-via 40 (if any) and the reference wiring lines 35 at the surface of the reference wiring lines 35 and below and/or lateral to the void-inducing-via 40 are expected to be less than similar respective induced voids 9 within circuit structure 152. In other words, circuit structure 152 is more prone to forming voids 9 relative to circuit structure 162.

The circuit structure 162 may further include wiring lines 20 within a lower metal layer or a higher metal layer, relative to the reference wiring lines 35. For example, if reference wiring lines 35 are located in M2, circuit structure 162 may further include one or more wiring lines 20 within M1, as depicted, and/or one or more wiring lines 20 within M3 (not shown). The circuit structure 162 may further include contact vias 30 within a lower via layer, relative to reference wiring lines 35. For example, if reference wiring lines 35 are located in M2, circuit structure 162 may further include a contact via 30 within V1 that electrically connects the wiring line(s) 20 within M1 and the reference wiring lines 35, respectively. Depending upon the implementation, the void-inducing-via 40 (if any) may or may not electrically contact a wiring line 20 (not shown) in the higher metal layer M3. If the void-inducing-via 40 does not electrically contact a wiring line 20 in the higher metal layer M3 the void-inducing-via 40 may also be referred to as a dummy via since it is electrically insulated from the above wiring line 20 (not shown).

The resistance across the circuit structure 162 and across the reference wiring lines 35 may be measured utilizing known resistance measurement techniques. For example, the resistance across circuit structure 162 and across the reference wiring lines 35 may be measured between node 60 and node 62, as depicted. Because the number of induced voids 9 within circuit structure 162 associated with reference line 35 is expected to be less relative to circuit structure 152, the resistance across reference lines 35 and across circuit structure 162 should also be less.

For clarity, the compared resistances across circuit structure 162 and across circuit structure 152 should be measured between similar relative nodes. For example, if the resistance across circuit structure 152 is measured between nodes 60 and 62 of circuit structure 152, the comparison resistance across circuit structure 162 should also be measured between nodes 60 and 62 of circuit structure 162.

In comparing the measured resistances of the circuit structure 152 and circuit structure 162, the existence of voids 9 associated with reference lines 35 within circuit structure 152 may be determined if the comparison (e.g., difference, ratio, etc.) between the resistance across reference lines 35 and circuit structure 152 and the resistance across reference lines 35 and circuit structure 162 exceeds a predetermined threshold. The threshold increases proportionally with the difference between the number of void-inducing vias of circuit structure 152 and the number of void-inducing vias of circuit structure 162 (if any).

Figure 7:
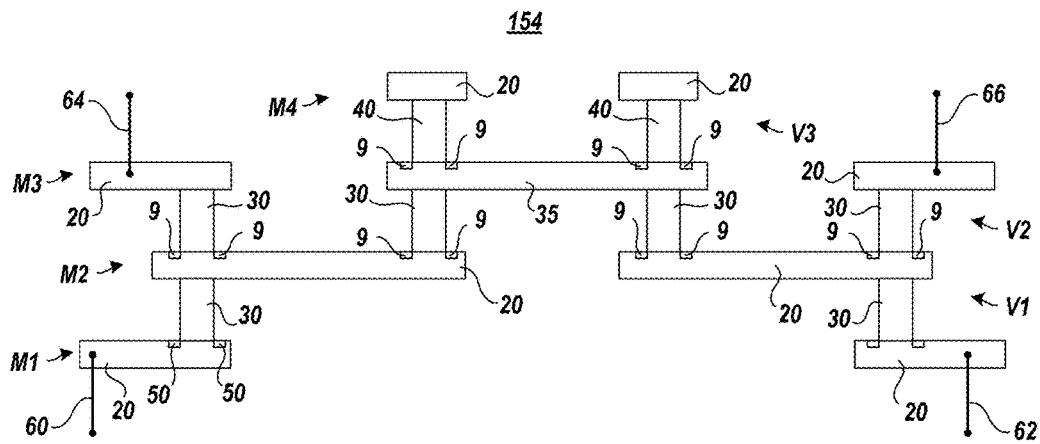

FIG. 7 depicts an exemplary circuit structure 154 including a reference wiring line 35 including one or more void-inducing-vias 40 formed upon and electrically contacting the reference wiring line 35. The void-inducing-via 40 may or may not induce a void 9 between the void-inducing-via 40 and the reference wiring line 35 at the surface of the reference wiring line 35 and below and/or lateral to the void-inducing-via 40. The actual existence of void 9 is determined by comparing resistance measurements between circuit structure 154 and a second circuit structure, later described.

The circuit structure 154 may further include wiring lines 20 within lower metal layers and/or a higher metal layer, relative to the reference wiring line 35. For example, if the reference wiring line 35 is located in M3, circuit structure 154 may further include one or more wiring lines 20 within M1 and in M2 and/or one or more wiring lines 20 within M4. The circuit structure 154 may further include contact vias 30 electrically connecting respective wiring lines 20 or electrically connecting a lower wiring line 20 to the reference wiring line 35. For example, if reference wiring line 35 is located in M3, circuit structure 154 may further include a contact via 30 within V2 that electrically connects the wiring lines 20 within M2 and the reference wiring line 35, respectively.

Depending upon the implementation, the void-inducing-via 40 may or may not electrically contact the wiring line 20 in the higher metal layer. For example, if reference wiring lines 35 is located in M3, the void-inducing-vias 40 within V3 electrically connects the reference wiring line 35 within M3 with a wiring line 20 within M4.

The resistance across the circuit structure 154 and across the reference wiring lines 35 may be measured utilizing known resistance measurement techniques. For example, the resistance across circuit structure 154 and across the reference wiring lines 35 may be measured between node 60 and node 62, between node 60 and node 66, or between node 64 and between 62.

Figure 8:
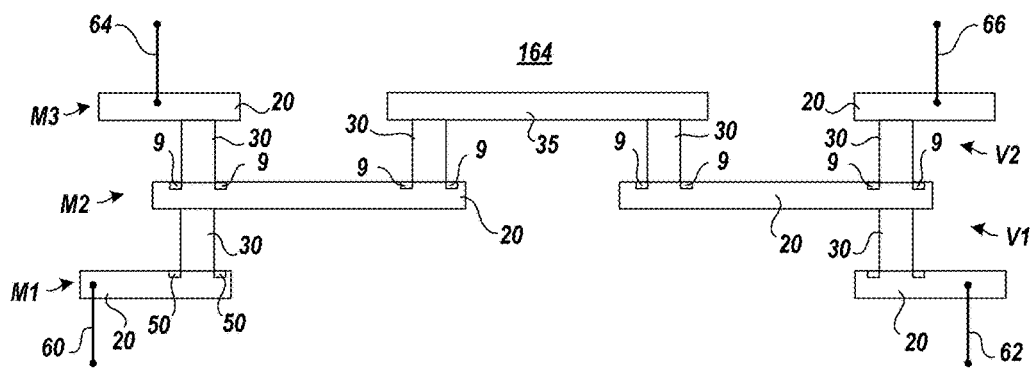

FIG. 8 depicts an exemplary circuit structure 164 including a reference wiring line 35 similar to the reference wiring line 35 of circuit structure 154. Generally, circuit structure 164 and circuit structure 154 may be compared to determine whether voids 9 exist between the void-inducing-via 40 and the reference wiring line 35 at the surface of the reference wiring line 35 and below and/or lateral to the void-inducing-via within circuit structure 154.

Circuit structure 164 includes less than or no void-inducing vias 40 formed upon and electrically contacting the reference wiring line 35 within structure 164, relative to the number of void-inducing vias 40 formed upon and electrically contacting the reference wiring line 35 within structure 154. Therefore, within circuit structure 164, the number of voids 9 between the void-inducing-via 40 (if any) and the reference wiring line 35 at the surface of the reference wiring lines 35 and below and/or lateral to the void-inducing-via 40 are expected to be less than similar respective induced voids 9 within circuit structure 154. In other words, circuit structure 154 is more prone to forming voids 9 relative to circuit structure 164.

The circuit structure 164 may further include wiring lines 20 within metal layers M1, M2, or M3. The circuit structure 164 may further include contact vias 30 electrically connecting respective wiring lines 20 or electrically connecting a lower wiring line with the reference wiring line 35. For example, if reference wiring line 35 is located in M3, circuit structure 164 may further include a contact via 30 within V2 that electrically connects the wiring line(s) 20 within M2 and the reference wiring line 35, respectively.

The resistance across the circuit structure 164 and across the reference wiring lines 35 may be measured utilizing known resistance measurement techniques. For example, the resistance across circuit structure 164 and across the reference wiring lines 35 may be measured between node 60 and node 62, between node 60 and node 66, etc. Because the number of induced voids 9 within circuit structure 164 associated with reference line 35 is expected to be less relative to circuit structure 154, the resistance across reference lines 35 and across circuit structure 164 should also be less.

For clarity, the compared resistances across circuit structure 164 and across circuit structure 154 should be measured between similar relative nodes. For example, if the resistance across circuit structure 154 is measured between nodes 60 and 62 of circuit structure 154, the comparison resistance across circuit structure 164 should also be measured between nodes 60 and 62 of circuit structure 164.

In comparing the measured resistances of the circuit structure 154 and circuit structure 164, the existence of voids 9 associated with reference lines 35 within circuit structure 154 may be determined if the comparison (e.g., difference, ratio, etc.) between the resistance across reference lines 35 and circuit structure 154 and the resistance across reference lines 35 and circuit structure 164 exceeds a predetermined threshold. The threshold increases proportionally with the difference between the number of void-inducing vias of circuit structure 154 and the number of void-inducing vias of circuit structure 164 (if any).

Figure 9:
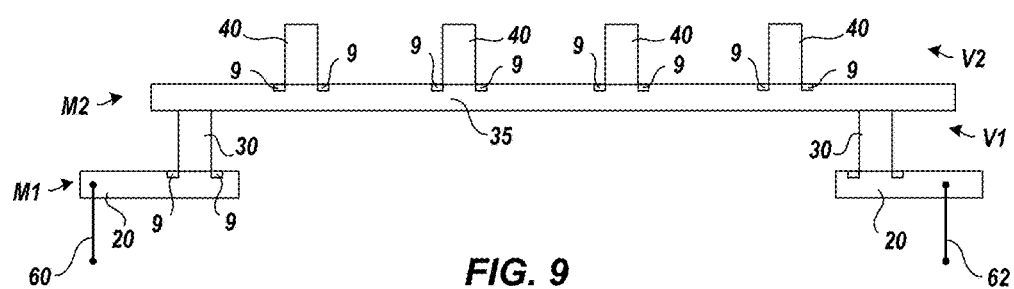

FIG. 9 depicts an exemplary circuit structure 158 including at least a reference wiring line 35 including void-inducing-vias 40 formed upon and electrically contacting the reference wiring line 35. The void-inducing-vias 40 of circuit structure 158 are so called dummy via since they do not make electrical contact with a wire line 20 (not shown) in M3. The void-inducing-via 40 may or may not induce a void 9 between the void-inducing-via 40 and the reference wiring line 35 at the surface of the reference wiring line 35 and below and/or lateral to the void-inducing-via 40. The actual existence of void 9 is determined by comparing resistance measurements between circuit structure 158 and a second circuit structure, later described. The void-inducing-via 40 does not, in and of itself, add resistance to the reference wiring line 35.

The circuit structure 158 may further include wiring lines 20 within a lower metal layer or a higher metal layer (not shown), relative to the reference wiring line 35. For example, if reference wiring line 35 is located in M2, circuit structure 158 may further include one or more wiring lines 20 within M1 and/or one or more wiring lines 20 within M3 (not shown). The circuit structure 158 may further include contact vias 30 within a lower via layer, relative to reference wiring line 35. For example, if reference wiring line 35 is located in M2, circuit structure 158 may further include a contact via 30 within V1 that electrically connects the wiring line 20 within M1 and the reference wiring line 35.

The resistance across the circuit structure 158 and across the reference wiring line 35 may be measured utilizing known resistance measurement techniques. For example, the resistance across circuit structure 158 may be measured between node 60 and node 62.

Figure 10:
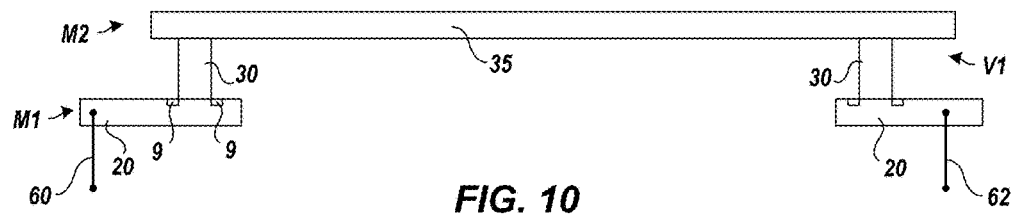

FIG. 10 depicts an exemplary circuit structure 168 including at least a reference wiring line 35 similar to the reference wiring line 35 of circuit structure 158. Generally, circuit structure 168 and circuit structure 158 may be compared to determine whether voids 9 exist between the void-inducing-via 40 and the reference wiring line 35 at the surface of the reference wiring line 35 and below and/or lateral to the void-inducing-via within circuit structure 158. Circuit structure 168 includes no void-inducing vias 40 upon and electrically contacting the reference wiring line 35. Therefore, within circuit structure 168, the number of voids 9 is expected to be less than the number of induced voids 9 within circuit structure 158. In other words, circuit structure 158 is more prone to forming voids 9 relative to circuit structure 168.

The circuit structure 168 may further include wiring lines 20 within a lower metal layer relative to the reference wiring line 35. For example, if reference wiring line 35 is located in M2, circuit structure 168 may further include one or more wiring lines 20 within M1. The circuit structure 168 may further include contact vias 30 within a lower via layer, relative to reference wiring line 35. For example, if reference wiring line 35 is located in M2, circuit structure 168 may further include a contact via 30 within V1 that electrically connects the wiring line(s) 20 within M1 and the reference wiring line 35, respectively.

The resistance across the circuit structure 168 and across the reference wiring line 35 may be measured utilizing known resistance measurement techniques. For example, the resistance across circuit structure 168 may be measured between node 60 and node 62. Because the number of induced voids 9 within circuit structure 168 associated with reference line 35 is expected to be less relative to circuit structure 158, the resistance across reference line 35 and across circuit structure 168 should also be less than the resistance across reference line 35 within circuit structure 158. In comparing the measured resistances of the circuit structure 158 and circuit structure 168, the existence of voids 9 associated with reference line 35 within circuit structure 158 may be determined if the comparison (e.g., difference, ratio, etc.) between the resistance across reference line 35 and circuit structure 158 and the resistance across reference line 35 and circuit structure 168 exceeds a predetermined threshold. The threshold increases proportionally with the difference between the number of void-inducing vias of circuit structure 158 and the number of void-inducing vias of circuit structure 168 (if any).

Figure 11:
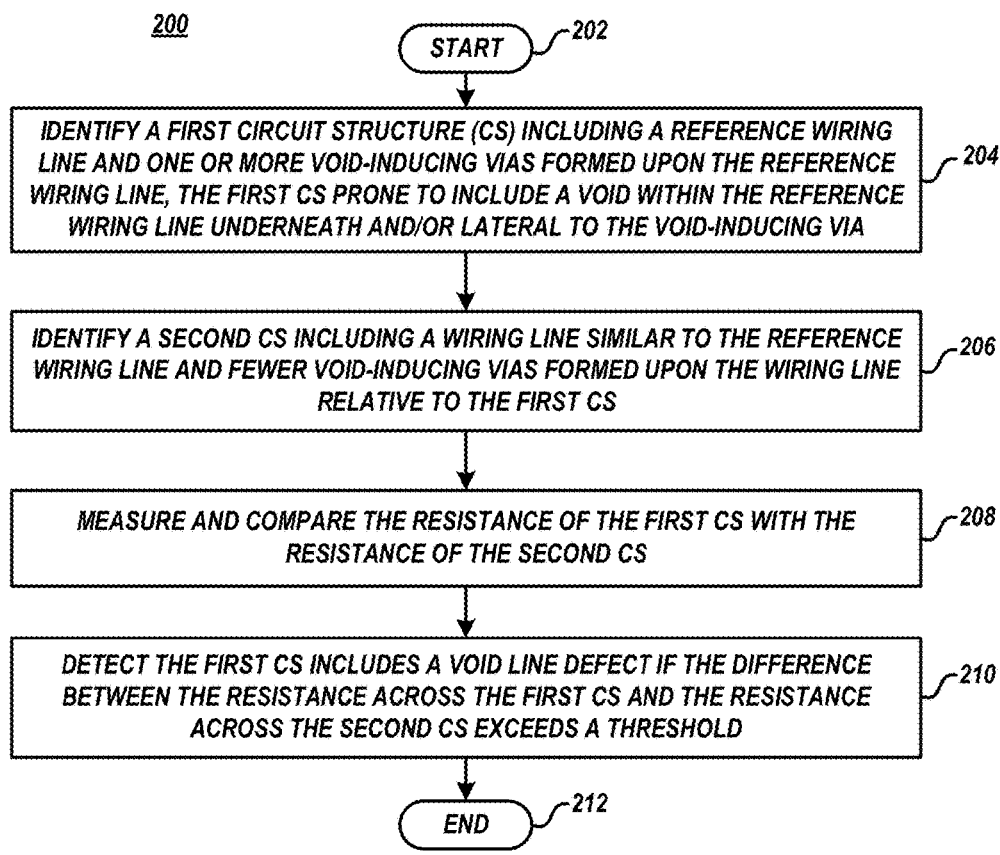
FIG. 11 depicts an exemplary method to determine whether a semiconductor structure includes voids between a wiring line and a contact via, in accordance with various embodiments of the present invention.

FIG. 11 depicts an exemplary method 200 to determine whether a semiconductor structure includes voids between a wiring line and a contact via, in accordance with various embodiments of the present invention. Method 200 may be utilized to detect the existence of voids created by lateral etching between a wiring line and a higher contact via at the surface of the wiring line and below and/or lateral to the contact via within a semiconductor structure without needing to destroy the semiconductor structure to obtain cross sections for analysis.

Method 200 begins at block 202 and continues with forming or otherwise identifying a first circuit structure (block 204) within a semiconductor device such as a wafer, IC chip, etc. The first circuit structure includes a reference wiring line and one or more void-inducing vias upon the reference wiring line and in electrical contact with the reference wiring line. The first circuit structure is prone to include a void between the reference wiring line and void-inducing via conductor. The void is located on the surface of the reference wiring line underneath and/or lateral to the void-inducing via and is formed by lateral etching of conductive material of the reference wiring line and void-inducing via conductor during mask removal associated with the formation of a lower wiring line.

Method 200 may continue with forming or otherwise identifying a second circuit structure (block 206) within the semiconductor device. The first circuit structure and second circuit structure may be located within a similar physical location within the semiconductor device. The second circuit structure includes a wiring line similar (i.e., similar length, cross section area, etc.) to the reference wiring line of the first circuit structure. The second circuit structure also includes less void-inducing vias upon the wiring line in electrical contact with the wiring line, relative to the first circuit structure. In other words, the second circuit structure is less prone to include voids on the surface of the wiring line underneath and/or lateral to the void-inducing via. In certain embodiments, the second circuit structure includes no void-inducing vias upon the wiring line.

Method 200 may continue with measuring and comparing the resistance across the first circuit structure and across the reference wiring line with the resistance across the second circuit structure and across the wiring line (block 208). The resistance may be measured utilizing known resistance measuring techniques of the semiconductor device that measures resistance of wiring within the device. The resistance measured wiring of the first circuit structure and the second circuit structure may span various wiring layers of the semiconductor device. For example, the measured wiring line of the first circuit structure may include a wiring line within level M1, a connector via electrically connecting the M1 wiring line and the M2 reference wiring line, and a connector via electrically connecting the M2 reference wiring line and a M1 or M3 wiring line.

Method 200 may continue with detecting that the first circuit structure includes one or more void between the reference wiring line and void-inducing via conductor if the comparison (e.g., difference, ratio, etc.) between the measured resistance across the first circuit structure and across the reference wiring line and the measured resistance across the second circuit structure and across the wiring line exceeds a threshold (block 210). The threshold increases proportionally with the difference between the number of void-inducing vias of the first circuit structure and the number of void-inducing vias of the second circuit structure (if any). If voids are detected within the first circuit structure, it may be determined that voids created as a result of similar phenomena are located in other physical locations within the semiconductor device. Method 200 ends at block 212.

Figure 12:
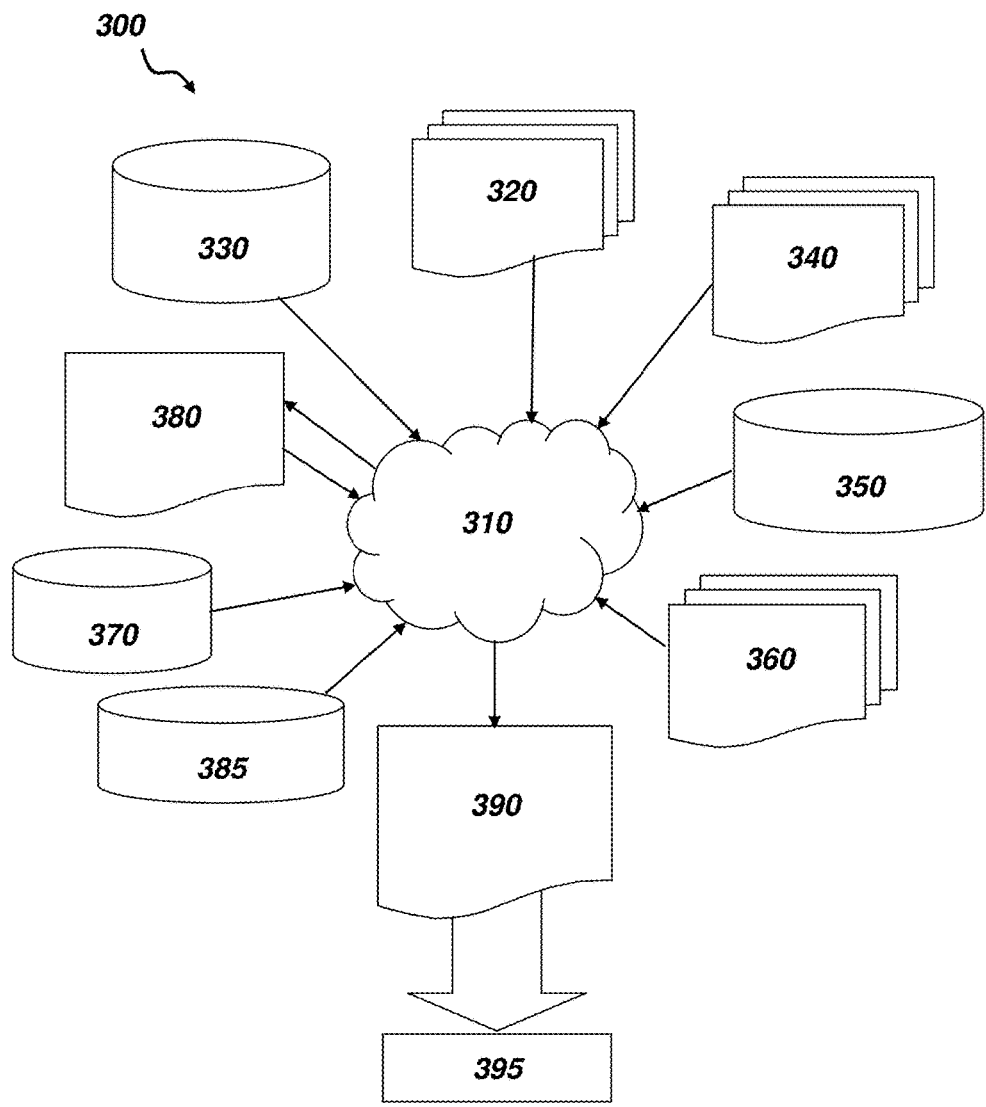
FIG. 12 depicts a flow diagram of a design process used in semiconductor design, manufacture, and/or test, in accordance with various embodiments of the present invention.

Referring to FIG. 12, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1A-10.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1A-10. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1A-10 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1A-10. In one embodiment, design structure 390 may comprise a compiled, executable HDL simulation model that functionally simulates the devices shown in FIGS. 1A-10.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1A-10. Design structure 390 may then proceed to a stage 395 where, for example, design structure 390: proceeds to tape-out, is released to manufacturing, is released to a mask house, is sent to another design house, is sent back to the customer, etc.

Figure 13:
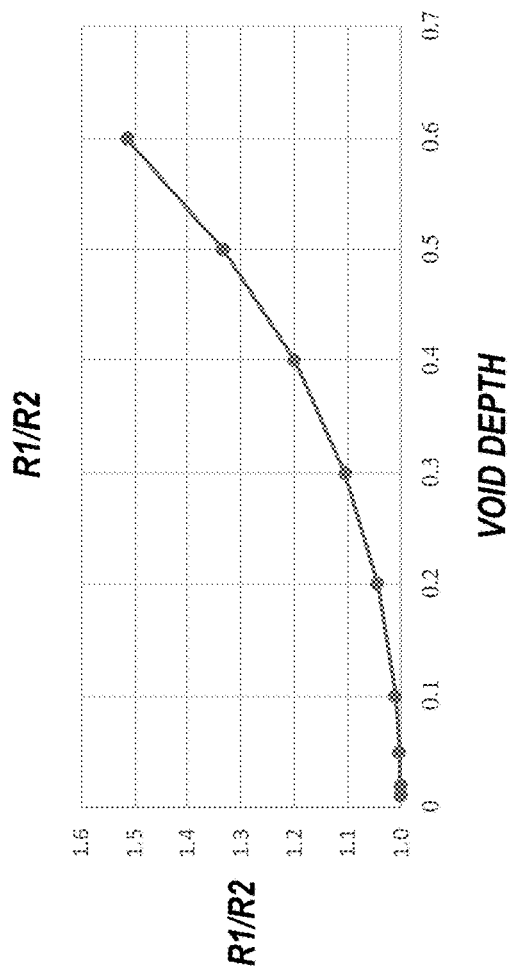
FIG. 13 depicts an exemplary resistance comparison threshold of a first circuit structure with an associated second circuit structure, in accordance with various embodiments of the present invention.

FIG. 13 depicts an exemplary resistance comparison threshold of a first circuit structure with an associated second circuit structure with no void-inducing vias 40 associated with the reference wiring line 35. The exemplary threshold compares a theoretical resistance ratio (R1/R2) of the theoretical resistance of the first circuit structure (R1) with the theoretical resistance of the second circuit structure (R2). In the presented example, resistance R2 may be defined by:

$$R_2 = \rho\left(\frac{L}{A}\right),$$

where ρ in this example is the resistivity of copper, where L is the length of the reference wiring line 35, and where A is the cross sectional area HW of the reference wiring line 35.

The theoretical ratio (R1/R2) is defined by $$\frac{R1}{R2} = \frac{1 + Nyz}{N(H - z)},$$

where N is the number of void-inducing vias 40 upon the reference wiring line 35, where y is a longitudinal void dimension, where z is a horizontal void dimension, where the void is assumed to be the same width of the reference wire line 35, and where H is the height of the reference wire line 35. The plot depicted in FIG. 13 assumes that y=2z, N/L=0.5, H=2, and W=1 and may serve as the threshold to which to compare the measured ratio (R1/R2). If the measured ratio (R1/R2) plot lays above the plotted threshold, it is determined that voids 9 exist within the first circuit structure.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

References herein to terms such as "vertical", "horizontal", etc. are made by way of example, and not by way of limitation, to establish a frame of reference. The term "horizontal" as used herein is defined as a plane parallel to the conventional plane or surface of the substrate 5, regardless of the actual spatial orientation of the semiconductor substrate 5. The term "vertical" refers to a direction perpendicular to the horizontal, as just defined. Terms, such as "on", "above", "below", "side", "higher", "lower", "over", "upper" and "lower", are defined with respect to the horizontal plane. It is understood that various other frames of reference may be employed for describing the present invention without departing from the spirit and scope of the present invention.

The invention claimed is:
1. A semiconductor structure comprising:
    a first circuit structure prone to lateral etching voids between a reference wiring line and one or more void-inducing contact vias at the surface of the wiring line and below the respective void-inducing contact vias, and;
    a second circuit structure not prone to lateral etching voids comprising a wiring line dimensionally similar to the reference wiring line and fewer void-inducing contact vias relative to the first circuit structure,
    wherein the first circuit structure includes:
        a first wiring line and a second wiring line in a first wiring layer below the reference wiring line;
        a first contact via between and contacting the first wiring line and the reference wiring line; and a second contact via between and contacting the second wiring line and the reference wiring line.

2. The structure of claim 1, wherein the one or more void-inducing vias within the first circuit structure are upon and electrically contact the reference wiring line.

3. The structure of claim 1, wherein the second circuit structure comprises no void-inducing vias upon and electrically contacting the wiring line.

4. The structure of claim 1, wherein the semiconductor structure is a wafer.

5. The structure of claim 1, wherein the one or more void-inducing contact vias are on and over the reference wiring line at locations laterally between the first contact via and the second contact via.

6. The structure of claim 1, wherein each of the reference wiring line and the one or more void-inducing contact vias are composed of copper (Cu).

7. The structure of claim 1, further comprising a first node at the first wiring line and a second node at the second wiring line, wherein the first node and the second node are configured for obtaining electrical resistance measurements of the reference wiring line.

8. The structure of claim 1, wherein the reference wiring line of the first circuit structure and the wiring line of the second circuit structure are each in a second wiring layer over the first wiring layer.

9. The structure of claim 8, wherein the first contact via of the first circuit structure and the second contact via of the first circuit structure are in a first via layer between the first wiring layer and the second wiring layer.

10. The structure of claim 9, wherein the one or more void-inducing contact vias are in a second via layer over the second wiring layer.

11. The structure of claim 10, wherein:
the one or more void-inducing contact vias of the first circuit structure comprises a first number of void-inducing contact vias;
the second circuit structure includes a second number of void-inducing contact vias in the second via layer and;
the first number is greater than the second number.

12. The structure of claim 10, wherein the second circuit structure comprises no void-inducing contact vias in the second via layer.

13. The structure of claim 10, wherein the one or more void-inducing contact vias are on and over the reference wiring line at locations laterally between the first contact via and the second contact via.

14. The structure of claim 10, wherein each of the reference wiring line and the one or more void-inducing contact are composed of copper (Cu).

15. A semiconductor structure comprising:
a first circuit structure prone to lateral etching voids between a reference wiring line and one or more void-inducing contact vias at the surface of the wiring line and below the respective void-inducing contact vias, and;
a second circuit structure not prone to lateral etching voids comprising a wiring line dimensionally similar to the reference wiring line and fewer void-inducing contact vias relative to the first circuit structure,
wherein one or more of the void-inducing vias within the first circuit structure are dummy vias.

16. A design structure embodied in a machine readable storage medium for designing, manufacturing, or testing an integrated circuit, the design structure comprising:
a first circuit structure prone to lateral etching voids between a reference wiring line and one or more void-inducing contact vias at the surface of the wiring line and below the respective void-inducing contact vias, and;
a second circuit structure not prone to lateral etching voids comprising a wiring line dimensionally similar to the reference wiring line and fewer void-inducing contact vias relative to the first circuit structure,
wherein the first circuit structure includes:
a first wiring line and a second wiring line in a first wiring layer below the reference wiring line;
a first contact via between and contacting the first wiring line and the reference wiring line; and
a second contact via between and contacting the second wiring line and the reference wiring line.

17. The design structure of claim 16, wherein the one or more void-inducing vias within the first circuit structure are upon and electrically contact the reference wiring line.

18. The design structure of claim 16, wherein one or more of the void-inducing vias within the first circuit structure are dummy vias.

19. The design structure of claim 16, wherein the second circuit structure comprises no void-inducing vias upon and electrically contacting the wiring line.

* * * * *